United States Patent [19]

Moore et al.

[11] Patent Number: 5,801,961
[45] Date of Patent: Sep. 1, 1998

[54] POWER MANAGEMENT SYSTEM FOR A SEMICONDUCTOR PROCESSING FACILITY

[75] Inventors: Gary M. Moore, Monte Sereno; Michael Peterson, Hayward; Steven C. Beese, Tracy, all of Calif.

[73] Assignee: Moore Epitaxial, Inc., San Jose, Calif.

[21] Appl. No.: 757,697

[22] Filed: Dec. 3, 1996

[51] Int. Cl.$^6$ .................... H02J 1/00; H02J 3/00; H02J 3/46; G01R 19/30
[52] U.S. Cl. .................... 364/492; 364/493; 307/19; 307/29
[58] Field of Search .................... 364/707, 492, 364/273.1, 273.2, 244, 244.6, 273, 273.3, 948.8, 948.4, 493, 468.28; 438/107; 395/750.03, 750.04, 750.06, 182.2, 750.02, 750.08; 307/31, 64; 365/227

[56] References Cited

U.S. PATENT DOCUMENTS

| | | | |
|---|---|---|---|
| 4,218,737 | 8/1980 | Buscher et al. | 364/493 |
| 4,419,665 | 12/1983 | Gurr et al. | 364/493 |
| 4,663,539 | 5/1987 | Sharp et al. | 364/492 |
| 5,399,531 | 3/1995 | Wu | 364/468.19 |
| 5,414,640 | 5/1995 | Seem | 364/492 |
| 5,444,637 | 8/1995 | Smesny et al. | 364/556 |
| 5,530,932 | 6/1996 | Carmean et al. | 364/240 |
| 5,583,419 | 12/1996 | Haller | 364/492 |

*Primary Examiner*—Emanuel T. Voeltz
*Assistant Examiner*—Cuong H. Nguyen
*Attorney, Agent, or Firm*—Skjerven, Morrill, MacPherson, Franklin & Friel LLP; Forrest E. Gunnison

[57] ABSTRACT

Semiconductor processing tools in a semiconductor processing facility are coupled to communicate with a power management system. The power management system monitors the power consumption status of each of the semiconductor processing tools. Using the power consumption status of each of the semiconductor processing tools, the power management system stages the operation of the semiconductor processing tools so as to maintain the power consumption of the semiconductor processing facility below a predefined maximum power consumption. Limiting the power consumption to less than the predefined maximum power consumption reduces the per die processing costs without incurring the expense of building a new semiconductor processing facility or without modifying the semiconductor processing tools for larger batch sizes or for greater throughput.

10 Claims, 6 Drawing Sheets

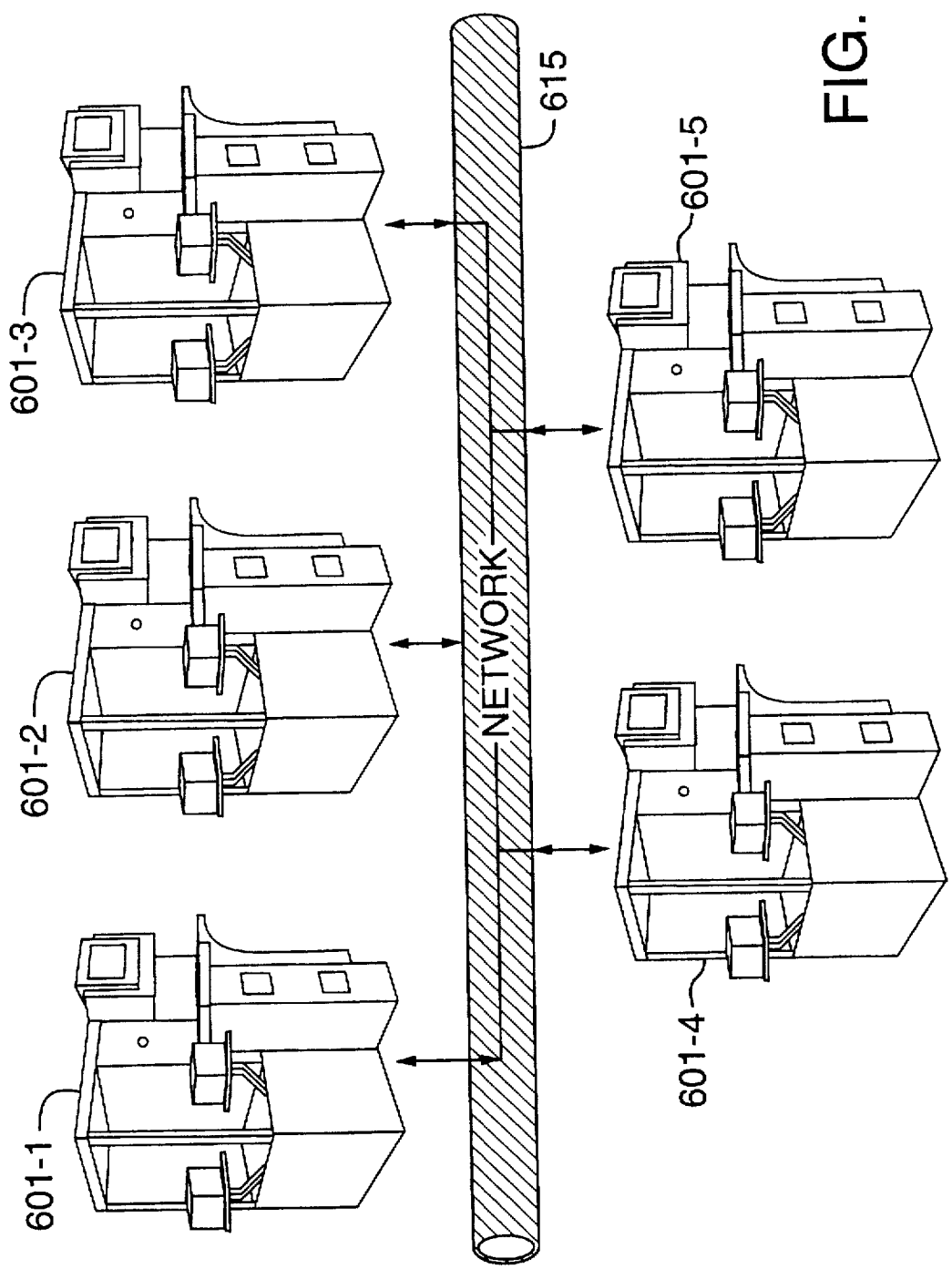

POWER MANAGEMENT SYSTEM FOR A SEMICONDUCTOR PROCESSING FACILITY

BACKGROUND OF THE INVENTION

1. Field of the Invention

This invention relates generally to semiconductor processing, and more specifically to controlling the peak power load in a semiconductor processing facility.

2. Description of Related Art

Historically, the semiconductor industry has focused on reducing the per die cost. This cost reduction primarily has focused on two aspects of semiconductor processing, substrate size and substrate throughput. Substrate throughput has focused on the number of substrates processed in a single batch, and the time required to process a single batch.

Both substrate size and substrate throughput have increased steadily over the years and have helped to reduce the per die cost. For example, the time required to process a single batch has been reduced using rapid thermal processing which allows greater production in a fixed time interval. Similarly, the rapid thermal processing technology has advanced to include multiple substrate batches.

Following the historical trends, further reductions in per die processing costs must await techniques for processing larger substrate diameters, larger batch sizes, or faster throughput. Other techniques typically have not been utilized, because, for example, any change to the semiconductor processing cycle is likely to affect the quality of the semiconductor processing. Nevertheless, techniques are needed for reducing the per die processing costs that are independent of substrate size and throughput.

SUMMARY OF THE INVENTION

According to the principles of this invention, semiconductor processing tools in a semiconductor processing facility are coupled to communicate with a power management system. The power management system monitors the power consumption status, i.e., a power consumption state, of each of the semiconductor processing tools.

Using the power consumption status of each of the semiconductor processing tools obtained through the monitoring operations, the power management system stages the operation of the semiconductor processing tools so as to maintain the power consumption of the semiconductor processing facility below a predefined maximum power consumption.

Limiting the power consumption to less than the predefined maximum power consumption reduces the per die processing costs without incurring the expense of building a new semiconductor processing facility or without modifying the semiconductor processing tools for larger batch sizes or for greater throughput. Also, the automatic staging of the operation of the semiconductor processing tools based upon predefined power consumption requirements does not affect the basic semiconductor processing cycle and so does not affect the quality of the substrates produced in the semiconductor processing facility.

A power manager, a computer process, in the power management system is initialized to define semiconductor processing tools subject to power management and to specify the maximum power consumption for the semiconductor processing facility. After the initialization, the power manager polls, e.g., monitors, the semiconductor processing tools to obtain a tool mode, e.g., a predefined power consumption state, of each to the tools.

When as a result of the monitoring operation, the power manager detects a high power consumption tool mode for a semiconductor processing tool as well as the tool mode for each of the other semiconductor processing tools. Upon detection of the high power consumption tool mode for a semiconductor processing tool, the power manager determines whether that semiconductor processing tool is enabled for high power consumption, e.g., the power manager determines whether the semiconductor processing facility is in a new power consumption state.

If the semiconductor processing tool is enabled already for high power consumption, no action is required of the power manager. Conversely, if the semiconductor processing tool is not enabled for high power consumption, the power manager either provides a high power consumption enable signal to the semiconductor processing tool, or provides a standby enable signal to place the semiconductor processing tool in a standby state.

Specifically, the power manager determines whether the high power consumption state of the semiconductor processing tool would cause the semiconductor processing facility to exceed the predefined maximum power consumption. If the predefined maximum power consumption will not be exceeded, the semiconductor processing tool is enabled to enter the high power consumption state by the power manager. Conversely, if the predefined maximum peak power will be exceeded, the semiconductor processing tool is placed in a standby state. Consequently, the power manager controls the per die cost of processing by limiting the maximum power consumption of the semiconductor processing facility.

BRIEF DESCRIPTION OF THE DRAWINGS

FIG. 6 is an illustration of another embodiment of a power consumption management system that includes a plurality of semiconductor processing tools interconnected over a network where each semiconductor processing tool controls its own operation to limit the overall power consumption of the semiconductor processing facility.

DETAILED DESCRIPTION

Figure 1:
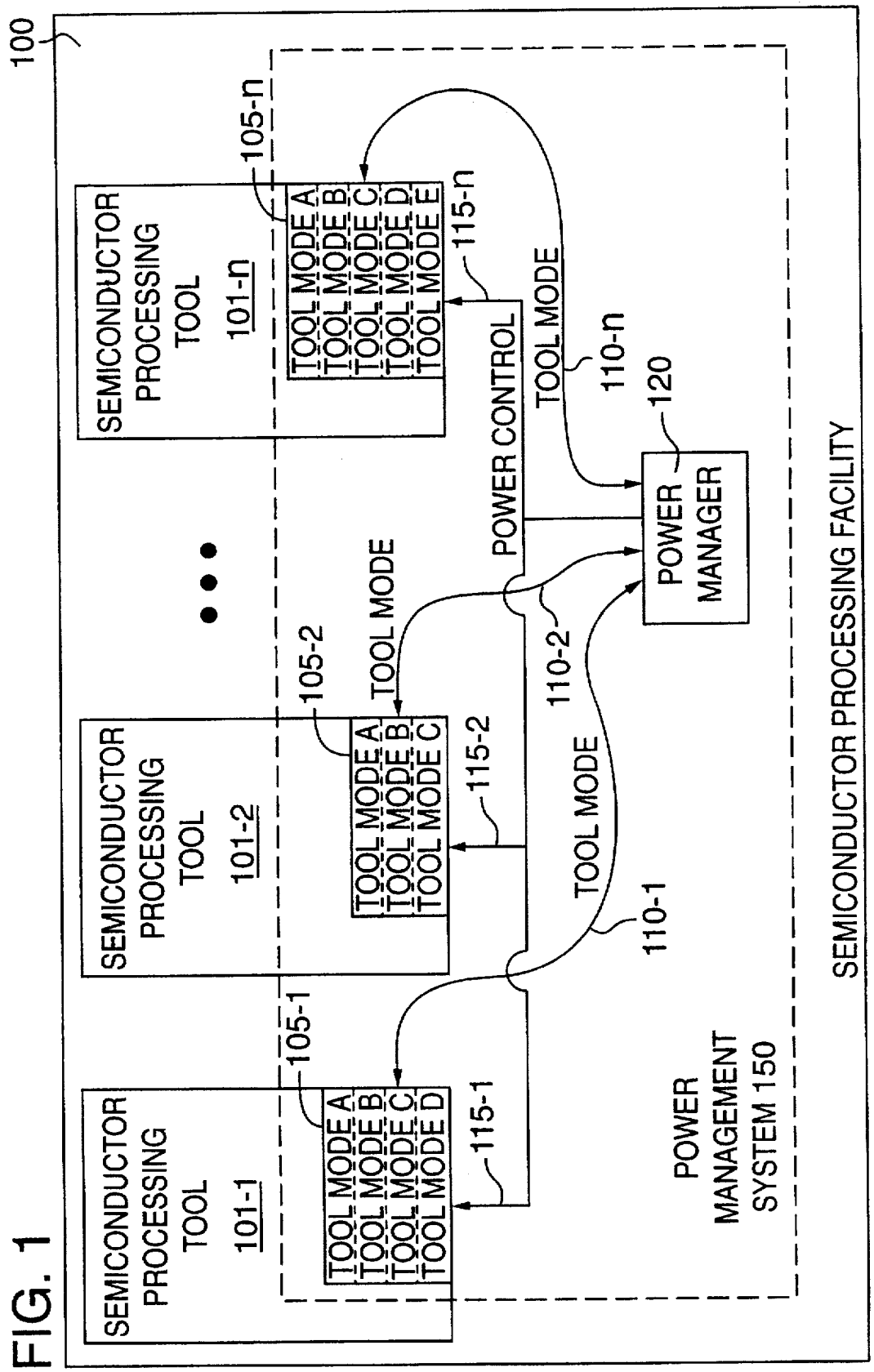
FIG. 1 is an illustration of one embodiment of a semiconductor processing facility that includes the power consumption management system of this invention.

According to the principles of this invention, semiconductor processing tools 101-1 to 101-n in a semiconductor processing facility 100 are coupled to communicate with a power management system 150. In one embodiment, power management system 150 monitors the power consumption status of each of semiconductor processing tools 101-1 to 101-n.

Using the power consumption status of each of semiconductor processing tools 101-1 to 101-n, power management system 150 stages the operation of semiconductor processing tools 101-1 to 101-n so as to maintain the peak power demand of semiconductor processing facility 100 below a predefined maximum peak power. As explained more completely below, maintaining the power consumption of semiconductor processing facility 100 below the predefined maximum peak power reduces the per die cost. Thus, the method and apparatus of this invention require neither new processing equipment nor new processing techniques to achieve the cost reduction.

Typically, for a semiconductor processing facility 100 that consumes a large volume of electricity over period of time, typically a month, at least a major component in the cost of the electricity is the peak power usage. In a prior art semiconductor processing facility, the power consumption of the facility was uncontrolled. Typically, at some time during each month, several semiconductor processing tools were operated simultaneously in a high power mode.

In contrast, power management system 150 reduces the semiconductor processing cost by staging the operation of semiconductor processing tools 101-1 to 101-n to maintain the peak power demand below the predefined maximum peak power. The reduction in peak power from the prior art peak power demand reduces the cost of production without adversely affecting the throughput of semiconductor processing facility 100.

Thus, unlike prior art techniques that reduced the per die cost of semiconductor processing by modifying semiconductor processing facility 100 either to process larger diameter wafers, or to process larger batch sizes, power management system 150 provides a reduction in per die processing cost utilizing existing semiconductor processing tools 101-1 to 101-n. Consequently, the reduction in per die processing costs are obtained without incurring the huge capital expenditures associated with modifying semiconductor processing facility 100 to process larger diameter substrates, or to process larger batch sizes.

According to the principles of this invention, a plurality of tool modes 105-i is defined for each semiconductor processing tool 101-i in semiconductor processing facility 100 where i ranges from one to N and N is the total number of processing tools in semiconductor processing facility 100. Each plurality of tool modes 105-i is a plurality of states TOOL_MODE_A, TOOL_MODE_B, . . . Each state TOOl_MODE_j where j is A,B, . . . , of plurality of tool modes 105_$_i$ defines a power consumption state of semiconductor processing tool 101-i.

In this embodiment, state TOOL_MODE_j of plurality of tool modes. 105_j for semiconductor processing tool 101-i is communicated over channel 110-i to power manager 120. However, as explained below, in another embodiment, power manager 120 is incorporated within each semiconductor processing tool 101-i that communicates with the power manager in each of the other semiconductor processing tools. In either embodiment, power manager 120 monitors states TOOL_MODE_j for the plurality of semiconductor processing tool 101-1 to 101-n.

In this embodiment, each semiconductor processing tool 101-i must receive a high power consumption enable signal over power control line 115-i prior to actually entering a high power consumption state. Herein, high power consumption is defined relative to the power consumption of the semiconductor processing tool and is the state during which the semiconductor processing tool requires the most power. When semiconductor processing tool 101-i is ready to enter a high power consumption state, i.e., initiates the operations necessary to enter the high power consumption state when an enable signal is given, semiconductor processing tool 101-i presents a tool mode of high power consumption.

Power manager 120 polls semiconductor processing tools 101-1 to 101-n to monitor the tool mode of each to the tools. Power manager 120 detects a high power consumption tool mode for semiconductor processing tool 101-i as well as the tool mode for each of the other semiconductor processing tools.

Upon detection of the high power consumption tool mode, power manager 120 determines whether semiconductor processing tool 101-i is enabled for high power consumption. If semiconductor processing tool 101-i is enabled for high power consumption, no action is required of power manager 120. Conversely, if semiconductor processing tool 101-i is not enabled for high power consumption, power manager 120 either provides the high power consumption enable signal over power control line 115-i, or sends a signal over power control line to place semiconductor processing tool 101-i in a standby state.

Specifically, power manager 120 determines whether the high power consumption state of semiconductor processing tool 101-i would cause semiconductor processing facility to exceed the predefined maximum peak power. If the predefined maximum peak power will not be exceeded, semiconductor processing tool 101-i is enabled to enter the high power consumption state by power manager 120. Conversely, if the predefined maximum peak power will be exceeded, semiconductor processing tool 101-i is placed in a standby state, until such time that semiconductor processing tool 101-i can be in the high power consumption state and the predefined maximum peak power not exceeded.

There are several alternative embodiments of power management system 150 of this invention, as explained more completely below. The particular embodiment is dependent upon the technique used to interconnect the semiconductor processing tools in processing facility with the power system manager. Thus, the embodiments described more completely below are only illustrative of the principles of the invention and are not intended to limit the invention to the specific embodiments described.

Figure 2:
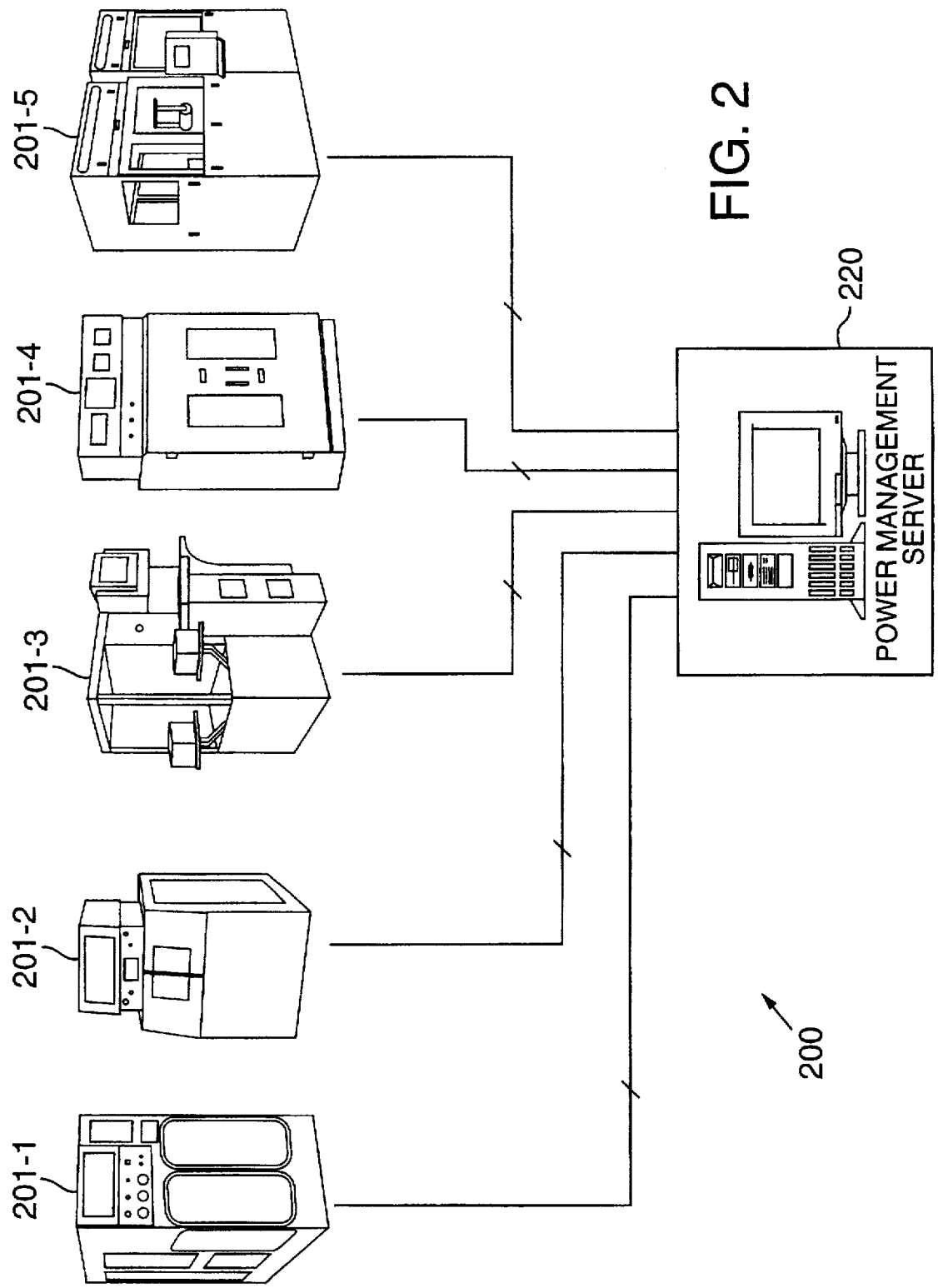
FIG. 2 is an illustration of an embodiment of a power management system that includes a plurality of semiconductor processing tools and a power management computer that receives and processes signals from each of the tools to determine the tool mode of each tool.

In FIG. 2, a semiconductor processing facility has a plurality of semiconductor processing tools 201-1 to 201-5 coupled to a power management system 200 that includes power management computer 220. The particular tools actually chosen as semiconductor processing tools 201-1 to 201-5 are not a critical aspect of this invention. In view of this disclosure those of skill in the art can implement the invention with a wide variety of semiconductor processing tools. For example, the principles of this invention could be used with any combination of the semiconductor processing tools listed in Table 1.

TABLE 1

| EXAMPLES OF SEMICONDUCTOR PROCESSING TOOLS | |
|---|---|
| Semiconductor Processng Tools | Supplier |
| Die Etcher, CVD and | Applied Materials |

TABLE 1-continued

EXAMPLES OF SEMICONDUCTOR PROCESSING TOOLS

| Semiconductor Processng Tools | Supplier |
| --- | --- |
| Epitaxial Systems | 3050 Bowers Avenue<br>Santa Clara, CA 95054-3201 |
| RTP and CVD Systems | AG Associates<br>1325 Borregas Avenue<br>Sunnyvale, CA 94089 |
| Epitaxy Systems | Concept Systems<br>1100 Auburn Street<br>Fremont, CA 94538 |
| CVD and Epitaxy Systems | Emcore<br>35 Elizabeth Avenue<br>Somerset, NJ 08873-1214 |
| CVD and Ion Implantation Systems | Genus<br>1139 Karlstad Avenue<br>Sunnyvale, CA 94089-2117 |
| CVD, Annealing and Diffusion/Oxidation Systems | Silicon Valley Group<br>2240 Ringwood Avenue<br>San Jose, CA 95131-1224 |
| CVD and Dry Product Etch Systems | Kokusai Electric Co., Ltd.<br>Mori 18th Building, 2-3-13<br>Toranomon<br>Minato-ku Tokyo 105<br>Japan |

Figure 3:
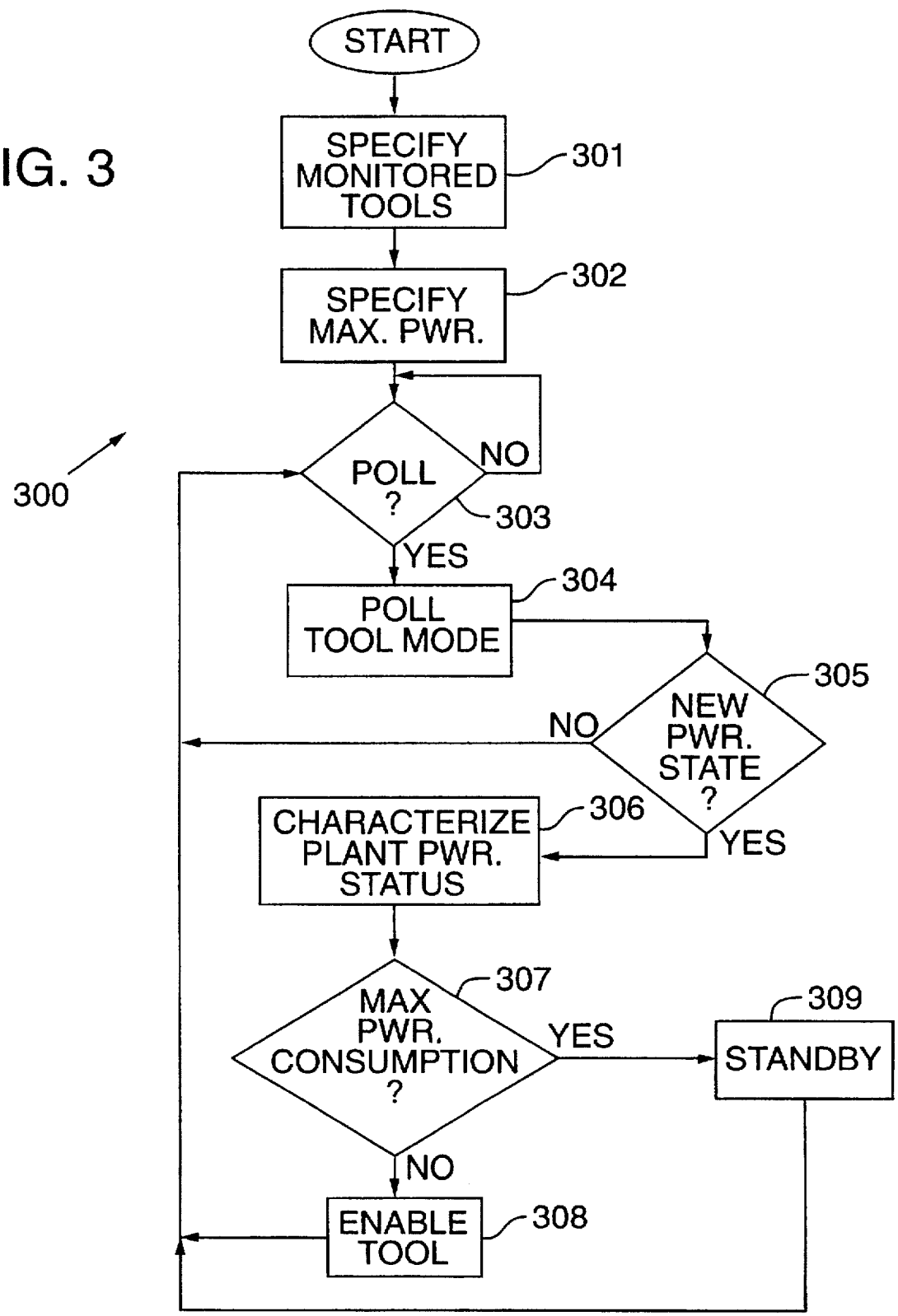
FIG. 3 is a process flow diagram of a power consumption management process performed by the power management computer of FIG. 2.

In this embodiment, each of semiconductor processing tools 201-1 to 201-5 provides selected signals, either analog, digital or a combination of analog and digital signals to I/O ports of power management computer 220. The signals provided by a particular one of semiconductor processing tool 201-1 to 201-5 are selected so that using only these signals, a power management process 300 (FIG. 3) executing on power management computer 220 can determine the power consumption state of the semiconductor processing tool.

In this embodiment, four tool modes are defined for each tool. The four tool modes are presented in Table 2.

TABLE 2

SEMICONDUCTOR PROCESSING TOOL MODES

| Tool Mode | State |
| --- | --- |
| A | Low Power (Stand By) |
| B | Heat-up (Max. Current Draw) |
| C | Steady State Operation |
| D | Heater Off |

The parameters within a semiconductor processing tool that define these tool modes are known to those of skill in the art as are the techniques of processing the signals representative of these parameters and providing the processed signals to a computer. Consequently, the specific connections with the semiconductor processing tool and the techniques used to process the signals at those connections are not an essential aspect of this invention.

Hence, in this embodiment, when a power management process 300 is initiated in power management computer 220, specify monitored tools operation 301 determines the number of semiconductor processing tools in operation. In one embodiment, the number of operating semiconductor processing tools is stored in a non-volatile memory of power management computer 220, and specify monitored tools operation 301 simply retrieves that number from the non-volatile memory. In another embodiment, specify monitored tools operation 301 asks the user to enter the number of semiconductor processing tools in operation. The number entered is stored by operation 301 for subsequent use in process 300.

Upon completion of specify monitored tools operation 301, processing transfers to specify maximum power consumption operation 302. In this embodiment, the peak power consumption is limited by specifying the number of semiconductor processing tools that simultaneously can be in tool mode B, i.e., in the heat-up state. Alternatively, in another embodiment, the maximum power consumption could be defined by specifying the total maximum amperes, or perhaps, the number of tools in tool mode B and the number of tools in tool mode C. For example, the total maximum amperes could be defined in terms of the power consumption of all the tools operating in a steady-state condition plus ten percent of that amount. The particular criterion chosen depends on the configuration and processing cycles of the various semiconductor processing tools within the semiconductor processing facility. In each case, the maximum power consumption is defined in specify maximum power consumption operation 302.

The maximum power consumption can be either stored on a non-volatile memory of power management computer 220, or specify maximum power consumption operation 302 can ask the user to enter the number of semiconductor processing tools that simultaneously can be in tool mode B, for example. The number entered is stored by operation 302 for subsequent use in process 300.

Upon completion of specify maximum power consumption operation 302, power management process 300 is initialized for power management and processing transfers to poll check operation 303. Process 300 periodically polls the monitored semiconductor processing tools to determine the tool mode of each of the tools. The polling can be initiated in several ways.

In one embodiment, power management process 300 operates a poll timer, and each time the poll timer times out, initiate poll check operation 303 transfers processing to poll tool mode operation 304. In another embodiment, initiate poll check operation 303 continually monitors the signals on the I/O ports from the monitored semiconductor processing tools. When initiate poll check operation 303 detects that one of the monitored semiconductor processing tools has generated a signal or signals indicating that the tool is ready to initiate tool mode B, power management process 300 transfers to poll tool mode operation 304.

In yet another embodiment, when an initiate tool mode B signal, i.e., a signal indicating initiation of tool mode B, is received by the I/O port of power management computer 220 for that semiconductor processing tool, the I/O port generates an interrupt to the processor of power management computer 220. In response to the interrupt, process 300 is called and initiate poll check operation 303 transfers to poll tool mode operation 304.

In poll tool mode operation 304, each of the I/O ports is queried for the number of monitored tools specified in operation 301. Note that this assumes that when a semiconductor processing tool is taken out of service, the I/O port for that tool is also taken out of service so that only the total number of operative I/O ports is required to complete poll tool mode operation 304. Alternatively, operation 301 could specify specific I/O ports that are to be accessed in the power management and in this case, poll tool mode operation 304 polls the specified I/O ports.

In poll tool mode operation 304, power management process 300 receives the signals from each of the monitored semiconductor processing tools. Using these signals, poll tool mode operation 304 generates a tool mode for each of monitored semiconductor processing tools. Poll tool mode operation 304 transfers processing to new power consumption state check 305.

In this embodiment, as each semiconductor processing tool is enabled for high power consumption, process 300, as explained more completely below, maintains a record of the status. Thus, new power consumption state check 305 first determines whether a semiconductor processing tool that had tool mode B has left that state and entered tool mode C. If such a change is detected, the semiconductor processing tool is removed from the list of tools in the high power consumption state in new power consumption state check 305.

Next new power consumption state check 305 determines whether a semiconductor processing tool is ready for high power consumption, but is not enabled for high power consumption, i.e., the tool does not appear on the list of tools in the high power consumption state. If a semiconductor processing tool is ready for high power consumption, but is not enabled, processing transfers to characterize semiconductor processing facility power status 306 and otherwise returns to initiate poll check 303.

In characterize semiconductor processing facility power status operation 306, the number of semiconductor processing tools in tool mode B is determined. The number of semiconductor processing tools in tool mode B includes the semiconductor processing tool that is ready to initiate heat-up. Upon completion of characterize semiconductor processing facility power status operation 306, processing transfers to maximum power consumption check operation 307.

Maximum power consumption check operation 307 compares the number of semiconductor processing tools in tool mode B with the maximum number specified in operation 302 to determine whether the additional semiconductor processing tool can be permitted to begin high power consumption. If the total number of semiconductor processing tools in tool mode B is less than the maximum number specified, processing transfers to enable tool operation 308 and otherwise to standby operation 309.

In enable tool operation 308, power management computer 220 sends an enable signal to the semiconductor processing tool that is initiating the high power consumption state. The enable signal is required before the semiconductor processing tool actually begins the high power consumption. Also, enable tool operation 308 adds the enabled semiconductor processing tool to the list of tools in the high power consumption state. After generating the enable signal, operation 308 transfers processing to initiate poll check operation 303.

If the maximum number of semiconductor tools is in tool mode B, standby operation 309 sends a low power enable signal, e.g. a standby signal to the semiconductor processing tool that was initiating high power consumption. Standby operation 309 places the semiconductor processing tool in a queue of tools waiting for high power consumption.

Note that if the low power operation is not a normal part of the semiconductor processing cycle, the queue is unnecessary because a standby or low power status would mean that the tool is waiting to be enabled for high power consumption. In either case, upon the next poll, process 300 in check 305 detects that the semiconductor processing tool was placed in a standby mode and either enables high power consumption, e.g., heatup, or maintains the standby mode.

Figure 4:
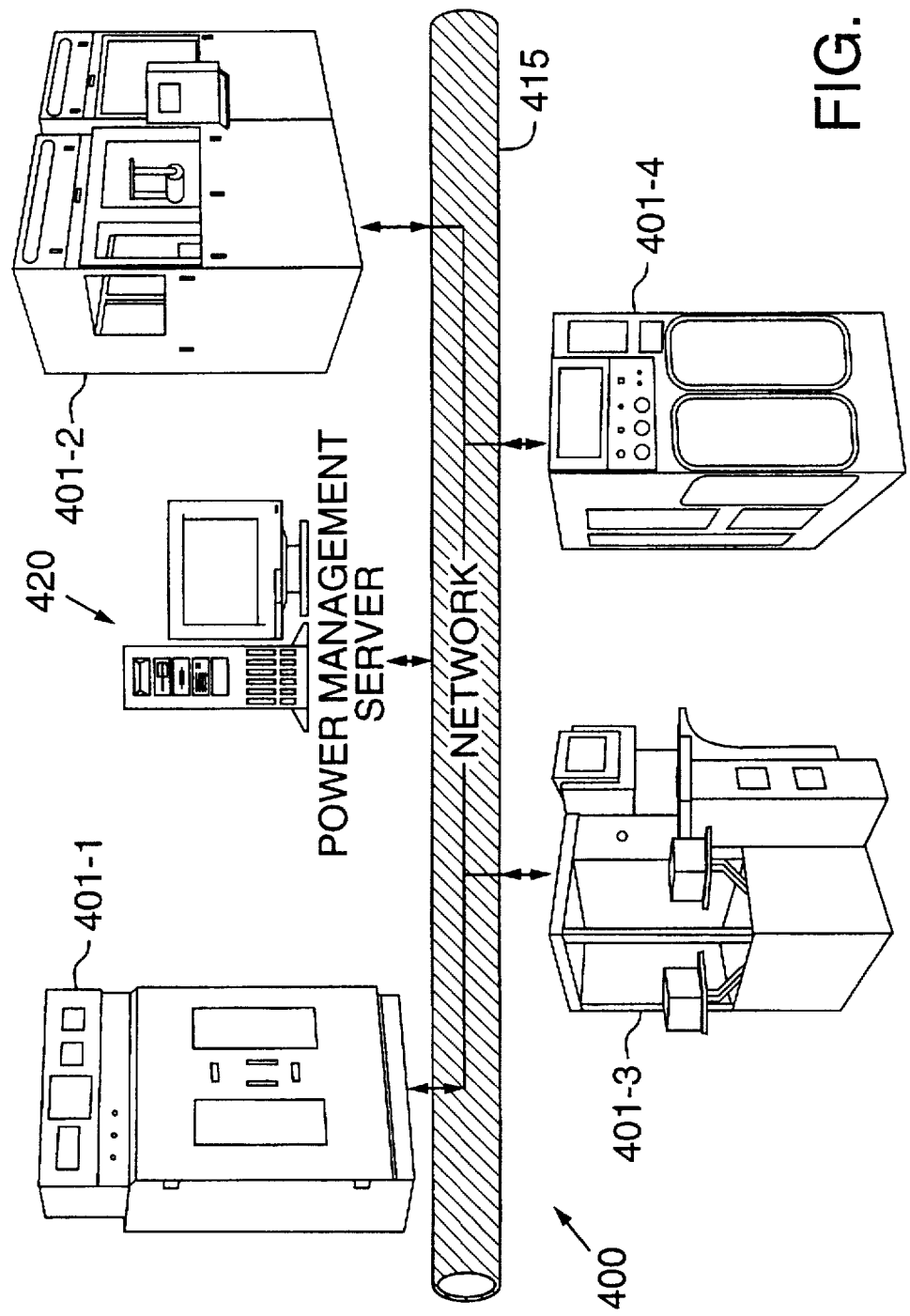
FIG. 4 is an illustration of another embodiment of a power consumption management system that includes a plurality of semiconductor processing tools connected over a network to a power management server computer that receives and processes information from client processes executing on each of the tools.

In another embodiment, a plurality of semiconductor processing tools 401-1 to 401-4 (FIG. 4) are coupled to a power management system 400 that includes power management server computer 420. The particular tools actually chosen as semiconductor processing tools 401-1 to 401-4 are not a critical aspect of this invention. In view of this disclosure those of skill in the art can implement the invention with a wide variety of semiconductor processing tools.

Figure 5:
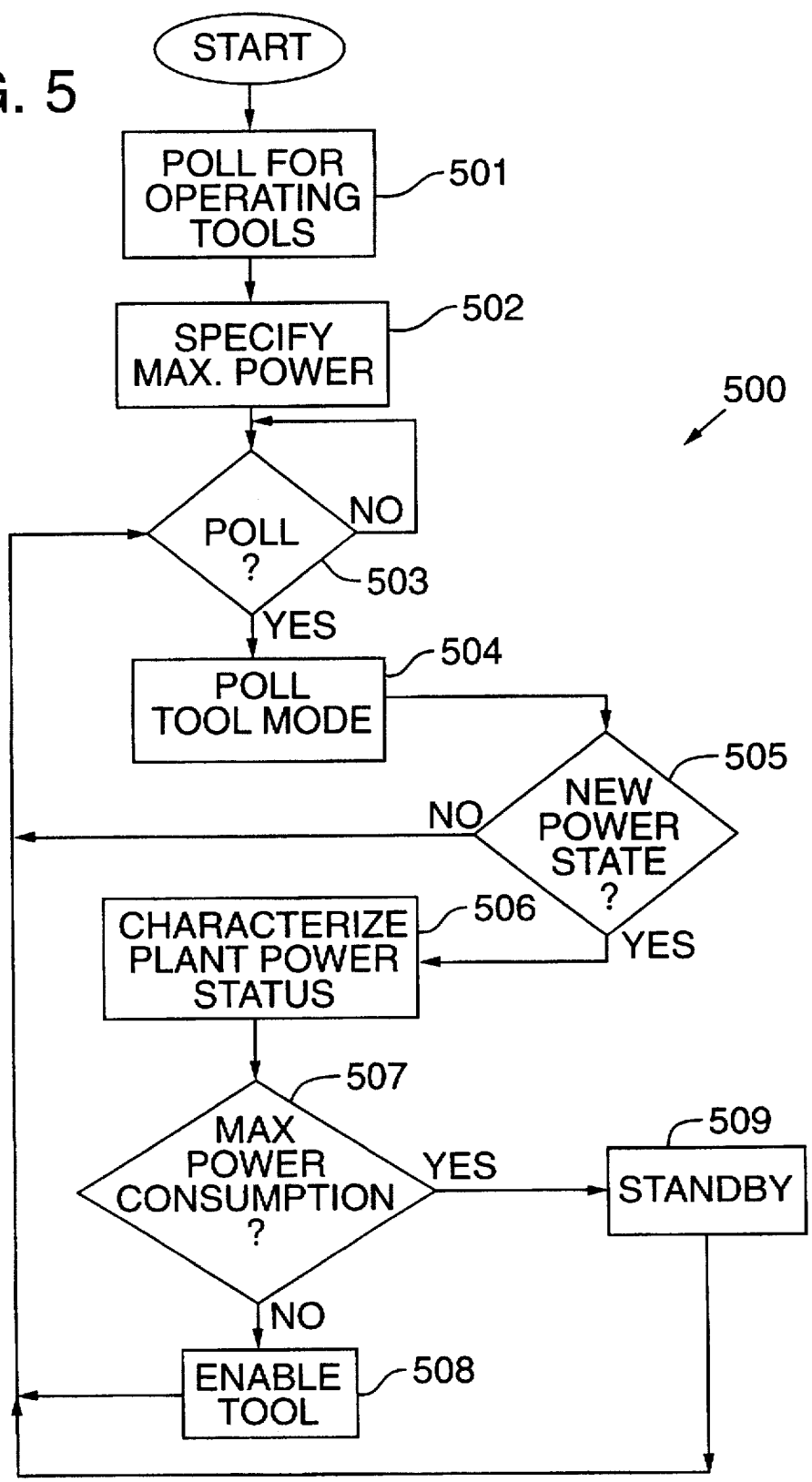
FIG. 5 is a process flow diagram of a power consumption management server process performed by the power management server computer of FIG. 4.

In this embodiment, each of semiconductor processing tools 401-1 to 401-4 utilize selected signals, either analog, digital or a combination of analog and digital signals. The selected signals are similar to those used in power management system 200. However, in this embodiment, the signals are analyzed using a client process that executes on a processor onboard the semiconductor processing tool. The client process communicates over a computer network 415 with a power management server process 500 (FIG. 5) that executes on power management server computer 420.

The client process onboard the semiconductor processing tool can be configured to perform a variety of operations. In this embodiment, the client process determines the tool mode of the semiconductor processing tool and sends the tool mode to power management server process 500 in response to a power status poll. Again, in this embodiment, the four tool modes defined in Table 1 above are utilized. Also, the communication and interaction of client and server processes are well known to those of skill in the art and so are not described in further detail. In view of the following disclosure, the processes of this invention can be implemented in a wide variety of client/server configurations that are compatible with the particular network operating system chosen.

In this embodiment, when power management server process 500 is initiated in power management computer 420, poll for operating tools operation 501 polls each of semiconductor processing tools 401-1 to 401-4 to determine which of the tools are operational. In response to the operational poll, the client process on each operating semiconductor processing tool sends a operational response to power management process 500. A list of the operational tools is generated for subsequent use.

Upon completion of poll for operating tools operation 501, processing transfers to specify maximum power consumption operation 502. In this embodiment, the peak power consumption is limited by specifying the number of semiconductor processing tools that simultaneously can be in tool mode B, i.e., in the heat-up state. Alternatively, in another embodiment, the maximum power consumption could be defined by specifying the total maximum amperes, as described above.

In either embodiment, the maximum power consumption can be either stored on a non-volatile memory of power management computer 420, or specify maximum power consumption operation 502 can ask the user to enter the number of semiconductor processing tools that simultaneously can be in tool mode B. The number entered is stored by operation 502 for subsequent use in process 500.

Upon completion of specify maximum power consumption operation 502, power management server process 500 is initialized, and processing transfers to poll check operation 503. Process 500 periodically polls the client processes in the operating semiconductor processing tools to determine the tool mode of each of the tools. The polling can be initiated in several ways.

In one embodiment, power management server process 500 operates a poll timer, and each time the poll timer times out, initiate poll check operation 503 transfers processing to poll tool mode operation 504. In another embodiment, when an initiate tool mode B signal, i.e., a signal indicating initiation of tool mode B, is detected by the client process of the semiconductor processing tool, the client process sends a message to power management server computer 420 that generates an interrupt to the processor of power management server computer 420. In response to the interrupt, process 500 is called and initiate poll check operation 503 transfers to poll tool mode operation 504.

In poll tool mode operation 504, power management server process 500 queries the client process of each of the operating semiconductor processing tools for the power consumption status. Power management server process 500 receives the power consumption status from the client process in each of the operating semiconductor processing tools. Poll tool mode operation 504 transfers processing to new power consumption state check 505.

In this embodiment, as each semiconductor processing tool is enabled for high power consumption, power management server process 500, as explained more completely below, maintains a record of the status. Thus, new power consumption state check 505 first determines whether a semiconductor processing tool that had tool mode B has left that state and entered tool mode C. If such a change is detected, the semiconductor processing tool is removed from the list of tools in the high power consumption state in new power consumption state check 505.

Next, new power consumption state check 505 determines whether a semiconductor processing tool is ready for high power consumption, but is not enabled for high power consumption, i.e., the tool is in the high power consumption state, but the tool does not appear on the list of tools in the high power consumption state. If a semiconductor processing tool is ready for high power consumption, but is not enabled, processing transfers to characterize semiconductor processing facility power consumption status 506 and otherwise returns to initiate poll check 503.

In characterize semiconductor processing facility power consumption status operation 506, the number of semiconductor processing tools in tool mode B is determined. The number of semiconductor processing tools in tool mode B includes the semiconductor processing tool that is ready to initiate heat-up. Upon completion of characterize semiconductor processing facility power consumption status operation 506, processing transfers to maximum power consumption check operation 507.

Maximum power consumption check operation 507 compares the number of semiconductor processing tools in tool mode B with the maximum number specified in operation 502. If the total number of semiconductor processing tools in tool mode B is less than the maximum number specified, processing transfers to enable tool operation 508 and otherwise to standby operation 509. Note in this embodiment, a total number is used. In another embodiment, the user could enter in operation 502 a table where each entry specified an allowed combination of tools in tool modes B and C. In such an embodiment, check operation 507 would determine whether the configuration obtained as a result of the poll was one of the allowed configurations in the table.

In enable tool operation 508, power management server computer 420 sends a heatup enable signal to the client process in semiconductor processing tool that is ready to heatup that in turn initiates the actual heatup. The heatup enable signal is required before the semiconductor processing tool actually begins the heatup. Also, enable tool operation 508 adds the enabled semiconductor processing tool to the list of tools in the high power consumption state. After generating the heatup enable signal, operation 508 transfers processing to initiate poll check operation 503.

If the maximum number of semiconductor tools is in tool mode B, standby operation 509 sends a low power enable signal, e.g. a standby signal, to the client process in the semiconductor processing tool that was initiating heatup, that in turn places the semiconductor processing tool in the standby mode of operation. Standby operation 509 also places the semiconductor processing tool in a queue of tools waiting for high power consumption. Note that if the low power operation is not a normal part of the semiconductor processing cycle, the queue is unnecessary because a standby or low power status would mean that the tool is waiting to be enabled for high power consumption. In either case, upon the next poll, process 500 in check 505 detects that the semiconductor processing tool was placed in a standby mode and either enables heatup or maintains the standby mode.

In yet another embodiment, a plurality of semiconductor processing tools 601-1 to 601-5 (FIG. 6) are interconnected by a network 615, and a power management process is included on a process computer of each of tools 601-1 to 601-5. In one embodiment, tools 601-1 to 601-5 are from the same manufacturer.

In the configuration of FIG. 6, the power management processes function similar to a peer-to-peer configuration.

Specifically, the power management process on a particular semiconductor processing tool handles the configuration of that tool. When the tool is ready to enter the high power consumption state, the power management process on that tool polls the other tools for their power status, i.e., requests a power status. In response to the poll, each tool sends a power consumption status to all other tools. The power management process on the requesting tool determines whether entering the high power consumption state will cause the semiconductor processing plant to exceed the maximum power consumption, e.g., whether the predefined number of tools in tool mode B would be exceeded, and either enables high power consumption or enables standby operation. With these modifications, the onboard power management process is equivalent to that described in FIGS. 3 and 5 and so that description is not repeated.

The specific embodiments of power consumption management process for a semiconductor processing facility are illustrative of the principles of this invention and are not intended to limit the invention to the particular embodiments described. In view of this disclosure, those of skill in the art will be able to implement the process in a wide variety of ways.

We claim:

1. A method of operating a semiconductor processing facility comprising:

monitoring power consumption of a plurality of semiconductor processing tools in said semiconductor processing facility wherein each semiconductor processing tools has a plurality of tool modes, and each tool mode defines a different state of power consumption; and limiting power consumption of said semiconductor processing facility by enabling a tool mode in said plurality of tool modes of one semiconductor processing tool in said plurality of semiconductor processing tools only when power consumption of said one semiconductor processing tool in said tool mode in combination with power consumption of other semiconductor processing tools in said plurality of semiconductor processing tools is less than a predefined maximum power consumption.

2. The method of operating a semiconductor processing facility as in claim 1 wherein said monitoring power consumption of a plurality of semiconductor processing tools in said semiconductor processing facility further comprises:

polling each semiconductor processing tool in said plurality of semiconductor processing tools to determine the tool mode of each semiconductor processing tool.

3. The method of operating a semiconductor processing facility as in claim 2 wherein said monitoring power consumption of a plurality of semiconductor processing tools in said semiconductor processing facility further comprises:

determining whether the power consumption status of said semiconductor processing facility is a new power consumption state of said semiconductor processing facility.

4. The method of operating a semiconductor processing facility as in claim 3 wherein said monitoring power consumption of a plurality of semiconductor processing tools in said semiconductor processing facility further comprises:

repeating said polling operation upon said determining operation finding that the power consumption status of said semiconductor processing facility is not a new power consumption state.

5. The method of operating a semiconductor processing facility as in claim 3 wherein said limiting power consumption operation is performed only upon said determining operation finding that the power consumption status of said semiconductor processing facility is a new power consumption state.

6. The method of claim 1 wherein said predefined maximum power is defined as a number of semiconductor processing tools in a predefined state.

7. The method of claim 6 wherein said predefined state is a heat-up state.

8. The method of claim 1 wherein said monitoring operation further comprises receiving signals from each of said plurality of semiconductor processing tools in a computer system.

9. The method of claim 8 wherein said monitoring operation further comprises determining a tool mode for each of said plurality of semiconductor processing tools using said signals.

10. A method of operating a semiconductor processing facility comprising:

initializing a maximum power consumption wherein said initialized maximum power consumption is a predefined power consumption;

polling each of a plurality of semiconductor processing tools to determine a power consumption state of each semiconductor processing tool in said plurality;

determining whether one of said semiconductor processing tools is ready to initiate high power consumption; and enabling said one of said semiconductor processing tools for high power consumption upon determining that said semiconductor processing tool is ready to initiate high power consumption only if power consumption of said semiconductor processing facility including said high power consumption of said one of said semiconductor processing tools is less than said predefined maximum power consumption.

\* \* \* \* \*